United States Patent [19]

Shils et al.

[11] Patent Number: 4,510,673
[45] Date of Patent: Apr. 16, 1985

[54] LASER WRITTEN CHIP IDENTIFICATION METHOD

[75] Inventors: Alan J. Shils, Yorktown Heights; John P. Ianni, Jr., Wappingers Falls, both of N.Y.

[73] Assignee: International Business Machines Corporation, Armonk, N.Y.

[21] Appl. No.: 507,311

[22] Filed: Jun. 23, 1983

[51] Int. Cl.³ .............................................. H01L 21/66
[52] U.S. Cl. ......................................... 29/574; 29/575
[58] Field of Search ................ 29/574, 575, 583, 589; 250/566; 235/454; 364/468, 478

[56] References Cited

U.S. PATENT DOCUMENTS

| | | | |
|---|---|---|---|
| 4,027,246 | 5/1977 | Caccoma et al. | 364/300 X |
| 4,150,331 | 4/1979 | Lacher | 357/85 X |
| 4,166,574 | 9/1979 | Yokoyama | 235/487 X |
| 4,419,747 | 12/1983 | Jordan | 365/96 X |

FOREIGN PATENT DOCUMENTS 8836   1/1981   Japan ..................................... 29/574

Primary Examiner—Brian E. Hearn
Assistant Examiner—Alan E. Schiavelli
Attorney, Agent, or Firm—Sughrue, Mion, Zinn, Macpeak & Seas

[57] ABSTRACT

A system of identifying each chip with identification data that is both human and machine readable. The chip identification is then used in sorting, storing, testing, assembling and failure analysis. The identification usage at these process steps eliminates chip part number mix-up and placement. It provides data used for quality control.

10 Claims, 4 Drawing Figures

LASER WRITTEN CHIP IDENTIFICATION METHOD

BACKGROUND OF THE INVENTION

1. Field of the Invention

This invention relates to a system of identifying an individual chip by laser scribing unique identification codes on that chip and the use of those codes during and after fabrication of a semiconductor device.

2. Prior Art

The fabrication of electrical components and in particular, integrated circuits, typically employs fabrication techniques wherein slices or wafers of a semiconductive material, such as silicon, are processed to contain a large number of devices. That is, each wafer or slice contains a number of individual circuits. The wafers are configured to have areas facilitating dicing of the wafer into discrete integrated circuit chips. Batch processing techniques are conventionally used in the fabrication of such semiconductor wafers and dicing into integrated circuit chips. Following batch processing, the individual chips are then tested, sorted, and eventually placed on integrated circuit modules.

In handling chips on an individual basis, errors in sorting may occur, chips may be mis-oriented when placed on the modules or, a chip of the wrong configuration is utilized. Thus, there is a need to identify each chip with a unique code such that its history can be accurately tracked from initial sorting established during testing, through dicing and through failure detection during system test and field returns of a commercially used device. Such an identification number should preferably be both machine and human readable and accurately describe, or lead to routinely generated production control information describing not only the chip part number identification but other supplementary manufacturing data such as manufacturing line, date of manufacture, unique conditions of manufacture and the like. This identification number would then be used in subsequent manufacturing steps. It would be employed to verify chip placement in a chip storage bank, to verify chip placement on a multi-chip substrate prior to reflow joining of that chip to the substrate and finally, to determine the individual chip identification for subsequent failure analysis. No electrical interaction is made with the chip to write or read the identification, such interaction being self-defeating to this system.

Within the prior art, no system is available to perform these tasks. U.S. Pat. No. 4,150,331 discloses an individual chip identification utilizing programmable circuitry on the chip surface in which a signature for that chip may be encoded. In accordance with this patent, diodes or other unidirectional current-conducting devices are connected between selected I/O pins in a common bus which is connected to a test and diagnostic pin. A digital identification number is used by the placement of diodes such that the composite circuitry defines a chip signature in binary form.

Such a technique, while providing identification for an individual chip, is not human readable and requires specific I/O circuitry to determine the identification of a particular chip. Additionally, the technique uses valuable chip area that would otherwise be employed for fabrication of a device. Additionally, if comprehensive data is to be placed on the chip, an excessive number of logic devices are required. Additionally, electrical activity within the chip to interrogate the identification may be in error, resulting in a false identification.

U.S. Pat. No. 4,027,246 relates to an automated integrated circuit manufacturing system wherein each wafer physically carries an identification code. The system describes a technique for reading the identification for each of the wafers and then transporting the wafers in accordance with their identity from a random access wafer storage unit to subsequent processing steps. The system operates under computer control such that wafers are received from the random access storage station may be read and based on the identification of the wafer, selectively gated for fabrication into large scale integrated circuit devices. The system operates for purposes of identification at the wafer level and therefore once those components are diced, no affirmative identification of individual chips is made.

The following patents and publications are representative of other art dealing with techniques of product identification.

U.S. Pat. No. 3,558,899 entitled "System and Method for Using Numerically Coded Etched Indicator Identification of Pieces of Semiconductor Material", issued Jan. 26, 1971;

U.S. Pat. No. 3,562,536 entitled "Radiation Sensitive Semiconductor Wafter Identification System", issued Feb. 9, 1971;

U.S. Pat. No. 3,597,045 entitled "Automatic Wafer Identification System and Method", issued Aug. 3, 1971;

U.S. Pat. No. 4,010,355 entitled "Semiconductor Wafer Having Machine Readable Indicies", issued Mar. 1, 1977;

U.S. Pat. No. 4,047,000 entitled "Control System for Computer Controlled Identification of Bottles", issued Sept. 6, 1977;

U.S. Pat. No. 4,201,338 entitled "Mold Identification, issued May 6, 1980;

IBM Technical Disclosure Bulletin, R. R. Jorgensen, Vol. 14, No. 4, Sept. 1971, pp. 1023–1025;

IBM Technical Disclosure Bulletin, "Chip Sorting", J. P. Wilson, Vol. 14, No. 5, Oct. 1971, p. 1479; and IBM Technical Disclosure Bulletin, "Identification of Wafers by Marginal Binary Notching and Template", J. S. Jackson, et al, Vol. 15, No. 7, Dec. 1972, pp. 2273–2274.

SUMMARY OF THE INVENTION

Given the shortcomings of the prior art, it is an object of the present invention to define an automated system of chip readable identification spanning chip testing through defect analysis of commercially utilized products.

Another object of this invention is to provide a system of semiconductor chip identification that is both human and machine readable.

A further object of this invention is to provide a system of semiconductor chip identification that does not impinge on chip real estate and therefore does not impact circuit design.

Yet a further object of this invention is to define a laser written chip identification system having an identification code that is usable at discrete production steps to eliminate manufacturing defects.

These and other objects of this invention are accomplished by a laser written semiconductor chip identification that, under computer control, utilizes a laser writer to scribe an identification code on the back of each chip.

The code is readable by machine or by human under a low power magnifying glass. Of necessity, the identification code is placed on the back of each chip prior to dicing of the wafer. The system then uses this identification throughout the areas of wafer test, dicing and selection, bonding/assembly/test fabrication and, during system test and field return units for defect analysis. That is, the identification is used throughout the life of the chip. The system in accordance with the present invention eliminates chip part number problems which occur on multi-chip substrate products. Thus, for example, prior to reflow chip joining onto the substrate, the laser written identification for a particular chip is read and verified against the chip part number required for that portion of the device. Any chip in the wrong place can therefore be corrected prior to soldering. When a module is returned from actual use, the record of the chips forming that module can be obtained from chip identification records.

In accordance with the present invention, chips, while still on the wafer, are tested to generate data concerning chip performance, that is, categorizing the chips as being all good, defective, or partially usable. Those test results are then buffered in storage for further use.

The chips are then individually scribed with a chip identification unique to that chip. The chip identification includes data concerning manufacturing codes delineating wafer type, part number, production controls, production line, date of manufacturing and the like. This is followed by the step of dicing the wafer. The chips are then sorted and placed in respective chip banks. The chips are read, that is, the identification is verified by having a reader determine whether the chip has been correctly placed in the proper cell of the chip bank for subsequent use.

When filling of the bank is completed, it is then sent to the bond/assemble/test level of manufacturing where, in accordance with computer control, chips are directed to proper placement at selected chip sites on a substrate. At this stage, the identification of each chip is again ascertained to determine whether a defect problem exists, such as, the chip in the wrong site, the chip identification being unreadable due to rotation or other improper positioning of the chip or, actual chip damage. If an error in the chip identification comparison occurs, the problem is corrected and the chip re-read. When all the proper chips are properly placed on the substrate, reflow joining of the chips to the substrate occurs.

Module testing and final module assembly then proceeds.

Following system manufacture, the module is tested and field installed. If failures of the module occur at either stage, that is, system test returns or field returns, failure analysis occurs and given the positive chip identification of each stage in manufacture, comprehensive failure analysis can be made.

This invention will be described in greater detail by referring to the attached drawings and description of the preferred embodiments that follows.

DESCRIPTION OF THE PREFERRED EMBODIMENT

Figure 1:
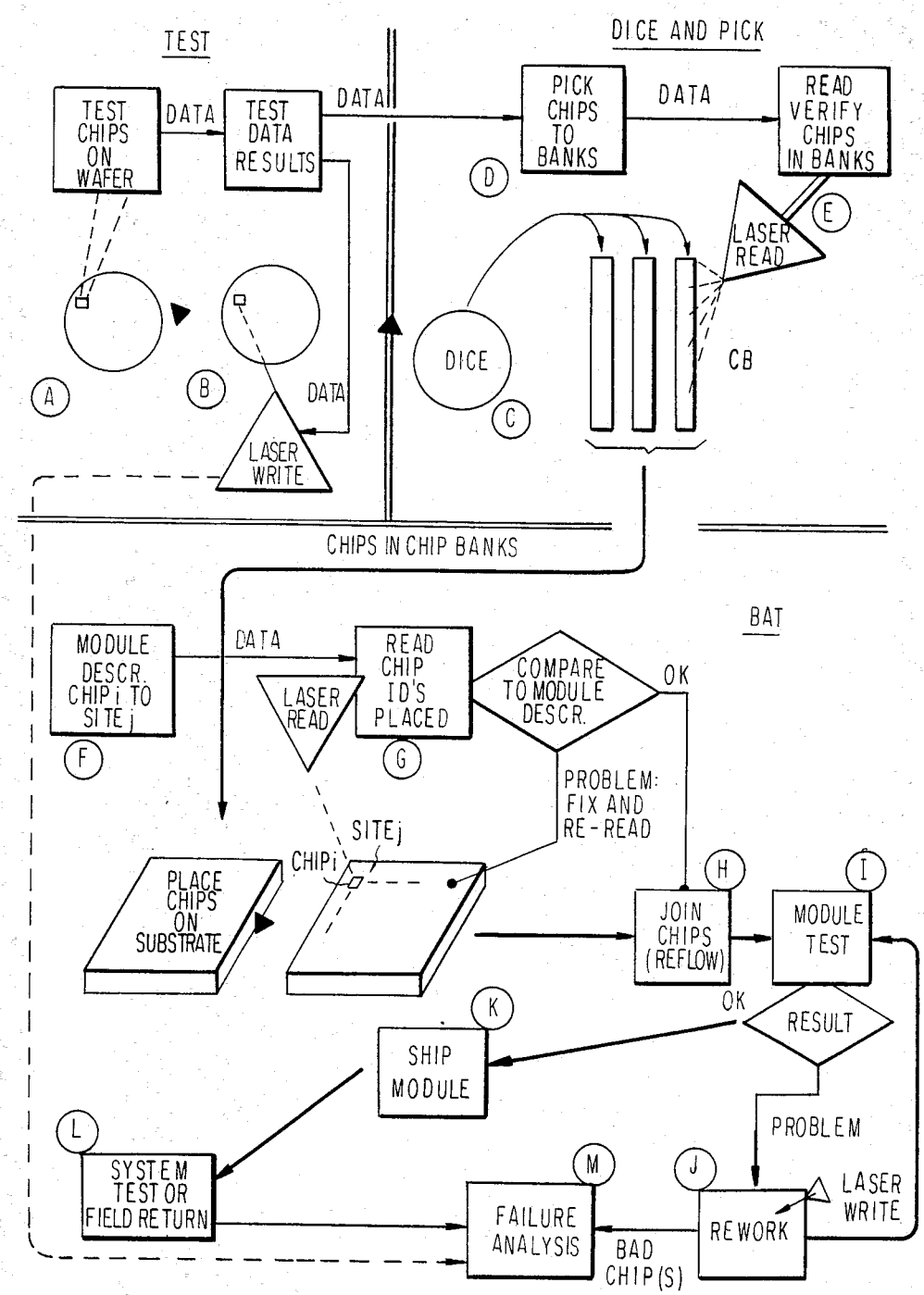
FIG. 1 is a diagrammatic flow chart of the manufacturing system in accordance with the invention wherein semiconductor chips are fabricated into integrated circuit devices utilizing chip identification at various steps in the process.

Referring now to FIG. 1, this system encompasses four areas (a) wafer test, (b) dicing and selection, (c) bond/assemble/test fabrication, and (d) field returned units. The present invention virtually eliminates chip part number mix-up difficulties which are common on multi-chip substrate devices. As shown in FIG. 1, at step (A), a wafer contains a number of areas which will ultimately be diced to form discrete chips. Tests are conducted vis-a-vis those chips while still on the wafer. Test data is generated relative to chip performance, that is, whether a chip is good/bad/or, only partially usable. The test results are then buffered for further use, that is, stored in the block "test data results".

In accordance with the present invention, the second step shown at area (B) is to encode the individual chips. This step of chip identification utilizes a scribing tool to provide positive identification and test data relative to individual chips. Such data includes unique manufacturing codes which identify wafer type, part number and production controls, such as the production line, date of manufacture and the like. Additionally, data generated during testing at stage (A) is used to provide additional written data.

The technique of scribing data for each chip on the wafer departs from that known in the prior art wherein only wafer serial numbers are generally provided. Thus, the wafer serial number is an identification generic to all chips but does not provide any unique identification for a particular chip on that wafer. Thus, the present invention extends the concept of identification to the chip level.

Figure 2:
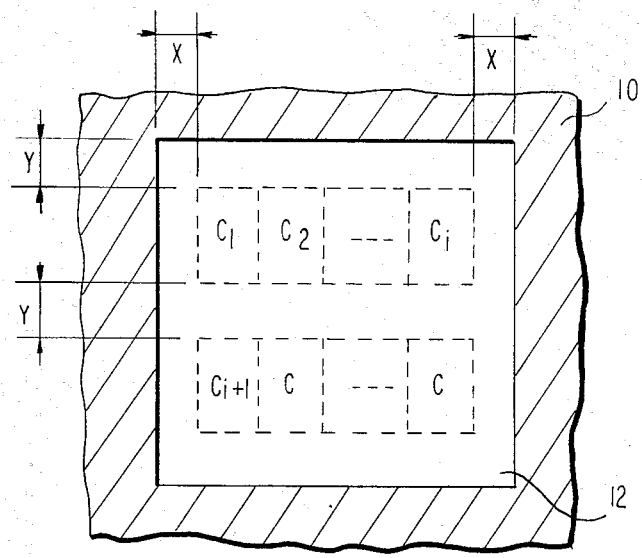
FIG. 2 is a plan view showing a sample chip size and the write area on the back side of a chip.

FIG. 2 shows an example of a chip write area wherein a wafer 10 contains a chip 12. The cross-hatched area is kerf to be sawed/diced away. The number of chips per wafer is variable upwards to several hundreds. Similarly, the chip size can also vary. As shown in FIG. 2, margin zones X and Y define areas about the circumference of the chip where scribing is forbidden. Additionally, if two lines are to be scribed, proper spacing between those lines must be delineated so that reading can take place. The number of characters of information $c_l$–$c_i$ in the first line and $c_{i+1}$—c in the second line are a function not only of chip size but also optical readability. Since human reading is desired, a minimum size is established to allow reading with a low power, unsophisticated optical system.

Figure 3:
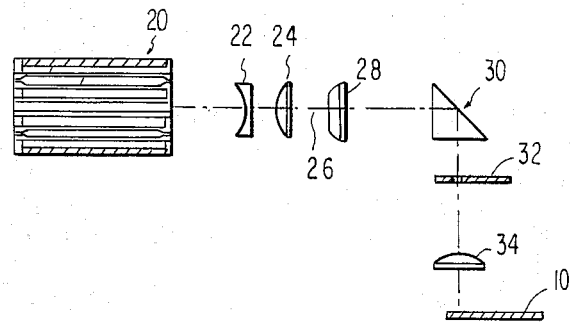
FIG. 3 is a schematic drawing showing the laser optics used to scribe a chip with its identification data.

In accordance with the present invention, scribing and reading on each chip is preferably done utilizing laser techniques. Such are known in the art, for example, used in conjunction with character-forming masks to scribe data on wafers. An example of a tool used for inscribing wafer serial numbers is shown in FIG. 3 employing laser techniques as a writing instrument. FIG. 3 illustrates a portion of the optics which would be used in conjunction with such a system to scribe chips. FIG. 3 schematically illustrates a laser source 20 and a first optical system comprising beam expander lens 22 and 24. The beam 26 then passes through a diffuser 28 and is deflected onto the wafer 10 by a prism 30. A mask 32 may be a gold-plated molybdenum mask having a series of font forming a translucent reticle. The mask is rotated and the translucent font modulates the beam 26 where it is focused by projection lens 34 onto the wafer 10. Scribing then takes place by moving the mask in accordance with data scribing requirements. The identification data is formed by a diffraction pattern. The portion of the scribing beam that strikes the dislocated silicon is reflected in a diffused pattern. The bars scribed are a theta modulated pattern that reflects several orders of diffraction. Beam steering onto the scribing area shown in FIG. 2 is accomplished by sweeping utilizing the prism 30 or any other known conventional beam steering technique. Such a device would utilize conventional storage techniques for identification and test data, such as floppy disc storage and reader verifying techniques to confirm that the wafer ID corresponds to the data input.

Following the step of scribing each chip with unique identifying data, the wafer is diced shown in step (C). Dicing is accomplished utilizing techniques known and established in the technology, such as diamond sawing.

The chips are then selected and placed in a chip bank. This step shown as stage (D) includes a reading step (E) to verify the selection and deposit process. Specifically, the back of each chip is read using data scribed in step (B). Errors, such as the wrong chip placed in the wrong bank, and/or the inability to read the chip ID caused by having the chip improperly placed, that is, rotated in the bank, are detected. Those defects together with others require that the chip be removed, corrected and/or replaced and then re-read in the bank. Chip holders called banks are common chip storage devices.

Figure 4:
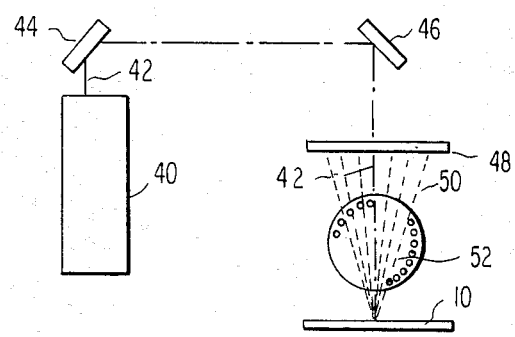
FIG. 4 is a schematic view showing optical components of a laser reader for scanning and reading chip identification data.

A suitable reader is shown in FIG. 4 utilizing techniques adapted from wafer readers. A laser source 40, typically a HeNe laser produces a beam 42 which is deflected by mirrors 44 and 46 onto a photodiode rosette 48. The photodiode 48 has a central opening through which the beam 42 passes through an encoder 52 onto the wafer 10. A reflected defraction pattern 50 occurs.

The portion of the beam that strikes the dislocated silicon on the back of the chip is reflected in a diffused pattern. Since the characters formed by the laser reader are theta-modulated, the reflected defraction pattern for each character is perpendicular to its angular axis. Thus, the part that illuminates the edge of the theta-modulated bar will reflect several orders of defraction. By utilizing encoder techniques, the unique defraction pattern, that is, the pattern for each character which is perpendicular to its angular axis is detected. A rotating prism will cause the laser beam 42 to scan all digits of the chip identification.

Once the chips have been properly stored in the bank, the bank is transported to the bond/assemble/test area (BAT) as shown in FIG. 1, steps (F) through (J). At this assembly site, a description of the module is furnished directing chip placement to a respective chip site on a substrate. That is, as shown, a particular chip (i) is directed to be placed at site (j) on a substrate. At this level of manufacture, (F) individual chips are placed on the substrate. The chips are not bonded. When the chips are placed on the substrate, they are again read step (G), utilizing techniques shown in FIG. 4 to verify their placement. The identification, unique to each chip, is read and compared to the identification of the chip specified to be at that particular location in accordance with the module description. Thus, in accordance with the present invention, defects, such a chip placed at the wrong site, or chips being rotated or mispositioned, or damaged, thereby rendering the identification unreadable are detected. If an error in this comparison step occurs, the chips are corrected and the substrate re-read. Once it has been determined that the module has been correctly assembled, joining, typically by reflow soldering terminals on said chip to terminals on said substrate step (H).

The present invention therefore offers an important advantage over the prior art since prior to actually joining the chips on the substrate, a positive determination is made concerning the correctness of the chip and its orientation on the substrate.

Following the step of joining, the completed module is tested (I). If defective, the module may be reconfigured and laser scribed to provide additional module coded results. This additional scribing is significant since when the chip is pulled for rework, there is a low probability of pulling the wrong chip and the added information can be subsequently used for failure analysis. Thus, as shown in FIG. 1, as a result of module testing, if no errors occur, the completed module is shipped for actual field use, (K). If, however, a problem is determined, reworking at step (J) occurs with additional scribing to provide additional information for subsequent failure analysis.

Following module manufacture and shipment, testing and field installation occurs. Modules may fail as a result of handling during shipment or in actual use, (L). Defective modules are returned for failure analysis shown at step (M). An important aspect of the present invention is the use of the laser scribe identification data at step (B) to provide an accurate correlation of the individual chip which has failed, vis-a-vis manufacturing data. Thus, if a pattern evolves showing chips from one manufacturing run being defective or the like, an accurate indication exists concerning the production area requiring review and correction. Such failure analysis can, as shown in FIG. 1, also takes place as an adjunct to reworking defective modules discovered during the module test (I). Thus, the present invention provides by scribing on the back of an individual chip its history from manufacture through any rework. This history provides significant data allowing for failure analysis, thereby promoting chip yields and reducing defect levels in shipped products.

Another advantage of this invention as shown in FIG. 2 is that the identification characters may be read by operators utilizing low power magnification. Thus, in addition to having the identification machine readable by the technique shown in FIG. 4, where necessary, an individual chip may be optically read by a human operator.

In accordance with the present invention, by continuously tracking an individual chip, defects in sorting and manufacture are minimized. Accurate data for quality control and failure analysis is thereby provided on a chip level, heretofore unknown in the present technology. It is apparent that these advantages cannot occur at the wafer level. Thus, the present invention offers important advantages over prior art techniques of merely scribing wafers.

While the invention has been defined relative to its preferred embodiment, it is apparent that modifications may be practiced without departing from the essential scope of this invention. For example, while laser writing techniques are delineated, other techniques of scribing identifying data on the back of a chip may be utilized. While laser reader techniques may be employed, as indicated, the identification can be human read or otherwise machine read utilizing known techniques. Moreover, while the use of chip identification has been described relative to a preferred manufacturing process, other uses for chip identification will be apparent to those of skill in this technology.

What is claimed is:

1. A method of producing a semiconductor device comprising the steps of:

providing a plurality of semiconductor chips on a wafer and testing said chips on said wafer to determine their useability;

writing on each chip identification data that may be read by a human or a machine;

dicing said wafer to separate said chips;

selecting and placing said chips into a storage device and reading said identification data to verify the proper location and orientation of said chips in said storage device;

removing said chips from said storage device and placing said chips on a substrate;

reading said identification data to verify the correct location and orientation of each chip on said substrate and, if incorrect, re-locating and/or re-orienting said chip; and joining said chips to said substrate.

2. The method of claim 1 further comprising the steps of testing said module and, if unacceptable, removing a defective chip and writing on that chip further identification data indicative of the failure mode of said chip.

3. The method of claim 1 further comprising the step of performing failure analysis on semiconductor devices returned from actual use utilizing said identification data.

4. The method of claim 1, wherein the step of writing identification data comprises the step of writing indicia on the back of said chip indicative of manufacture parameters.

5. The method of claim 4, wherein said writing is a laser written character using a laser scribing tool.

6. The method of claim 1, wherein the step of selecting and placing said chips into a storage device comprises the steps of laser reading said identification data on said chips after said chips have been placed in said storage device and, resorting and/or re-orienting any chip not properly located and/or oriented.

7. The method of claim 6, wherein said storage device is a chip collection bank.

8. The method of claim 1, wherein the step of joining said chips to said substrate comprises the step of reflow soldering terminals on said chip to terminals on said substrate.

9. The method of claim 1, wherein the step of reading comprising non-electric, non-contact reading of said chip identification data.

10. The method of claim 9, wherein said non-electric, non-contact reading is optical scanning of said chip.